United States Patent
Kameda

(10) Patent No.: US 9,081,539 B2
(45) Date of Patent: Jul. 14, 2015

(54) HOLDING MECHANISM FOR DISPLAY DEVICE AND ASSEMBLING METHOD OF THE SAME

(71) Applicant: CALSONIC KANSEI CORPORATION, Saitama (JP)

(72) Inventor: Mitsuaki Kameda, Saitama (JP)

(73) Assignee: CALSONIC KANSEI CORPORATION, Saitama (JP)

( * ) Notice: Subject to any disclaimer, the term of this patent is extended or adjusted under 35 U.S.C. 154(b) by 115 days.

(21) Appl. No.: 13/893,645

(22) Filed: May 14, 2013

(65) Prior Publication Data

US 2013/0301203 A1    Nov. 14, 2013

(30) Foreign Application Priority Data

May 14, 2012 (JP) ................................ 2012-110327

(51) Int. Cl.
| | |
|---|---|
| G02F 1/1333 | (2006.01) |
| F21V 1/00 | (2006.01) |
| F21V 21/00 | (2006.01) |
| F21V 7/04 | (2006.01) |
| G06F 1/16 | (2006.01) |
| H05K 13/00 | (2006.01) |
| B60K 35/00 | (2006.01) |
| G04G 17/04 | (2006.01) |

(52) U.S. Cl.
CPC .............. *G06F 1/1601* (2013.01); *B60K 35/00* (2013.01); *G02F 1/133308* (2013.01); *G04G 17/045* (2013.01); *H05K 13/00* (2013.01); *B60K 2350/00* (2013.01); *B60K 2350/2082* (2013.01); *B60K 2350/2086* (2013.01); *B60K 2350/941* (2013.01); *G02F 2001/13332* (2013.01); *G02F 2201/503* (2013.01); *G02F 2201/505* (2013.01); *Y10T 29/49002* (2015.01)

(58) Field of Classification Search
USPC ............................................................ 349/58
See application file for complete search history.

(56) References Cited

U.S. PATENT DOCUMENTS

| | | | |
|---|---|---|---|
| 6,816,213 B2 * | 11/2004 | Kato et al. ...................... 349/58 |
| 2006/0146486 A1 * | 7/2006 | Wikstrom et al. ............. 361/681 |
| 2007/0103908 A1 * | 5/2007 | Tabito et al. ................... 362/294 |

(Continued)

FOREIGN PATENT DOCUMENTS

| | | |
|---|---|---|
| EP | 1 150 199 | 10/2001 |
| EP | 1 453 281 | 9/2004 |

(Continued)

OTHER PUBLICATIONS

European Search Report (ESR) issued Sep. 19, 2013 in European Application No. EP 13 16 7539.

*Primary Examiner* — Hoan C Nguyen
(74) *Attorney, Agent, or Firm* — Wenderoth, Lind & Ponack, L.L.P.

(57) ABSTRACT

A holding mechanism for a display device has a front cover member attached to a surface of a housing containing the display device so as to cover the display device, and an elastic member arranged between the display device and a front cover member. A thin plate-like member having shape retention is attached to the elastic member on a side facing the front cover member, and the elastic member attached to the thin plate-like member is attached to an internal side of the front cover member to prevent an unsightly appearance and to make the adherence of the elastic member to the surface of the display device easier.

6 Claims, 7 Drawing Sheets

(56) References Cited

U.S. PATENT DOCUMENTS

2007/0109650 A1    5/2007  Yamada et al.
2009/0322994 A1*  12/2009  Satake et al. .................... 349/96
2010/0201908 A1*   8/2010  Ishida .............................. 349/58
2011/0222220 A1*   9/2011  Murakata et al. ........ 361/679.01

FOREIGN PATENT DOCUMENTS

| | | |
|---|---|---|
| JP | 3-100885 | 10/1991 |
| JP | 9-113880 | 5/1997 |

* cited by examiner

HOLDING MECHANISM FOR DISPLAY DEVICE AND ASSEMBLING METHOD OF THE SAME

CROSS-REFERENCE TO RELATED APPLICATIONS

The present application is based on and claims priority from Japanese Patent Application Number 2012-110327, filed on May 14, 2012, the disclosure of which is hereby incorporated by reference herein in its entirety.

BACKGROUND OF THE INVENTION

1. Field of the Invention

The present invention relates to a holding mechanism for a display device used for an indicator, a navigator and so on, and an assembling method of the holding mechanism for a display device.

2. Description of the Related Art

A vehicle such as an automobile has an instrument panel installed at a front portion in a vehicle interior. A controller of an air-conditioner is installed at the center in the width direction of the instrument panel. Some of these controllers of an air-conditioner have a display device.

FIGS. 8 to 10 illustrate a controller 1 of an air-conditioner having a conventional display device.

The controller 1 shown in FIGS. 8 to 10 includes a display device 2, a housing 3 containing the display device 2, and a front cover member 4 attached on a surface of the housing 3 so as to cover the display device 2.

Further, an elastic member 5 is interposed between a rim of the surface of the display device 2 and the front cover member 4.

In this case, the elastic member 5 is made of a soft material such as urethane, and is adhesively attached to the surface of the display device 2.

Thus, since the elastic member 5 is interposed between the display device 2 and the front cover member 4 so that a gap is not generated between the display device 2 and the front cover member 4, any dust or foreign substance does not enter an inner side of the display device 2 and the front cover member 4.

Moreover, an occurrence of noise caused by vibration and so on while the vehicle is moving can be prevented by avoiding direct contact of the display device 2 with the front cover member 4.

The display device 2 can forcibly be held by use of an elastic force of the elastic member 5.

Note that, a structure similar to the above configuration is disclosed, for instance, in Japanese Utility Model Application Publication No. H03-100885 (Patent Document 1).

However, the foregoing holding mechanism for the display device has a problem in that the elastic member 5 is difficult to handle in adhering on the surface of the display device 2, since the elastic member 5 is made of a soft material such as urethane and easily deformed.

Thus, a position variation in a prescribed position is likely to occur when adhering the elastic member 5 to the surface of the display device 2, and sometimes extra work such as re-adhering and so on is required.

Moreover, there is a problem in that the appearance becomes unsightly since the elastic member 5 is damaged by re-adhering, and the glue side on which the elastic member 5 is adhered becomes visible externally.

Further, as shown in FIG. 11, there is a problem in that the appearance becomes unsightly since a rim of the elastic member 5 is squeezed and protruded inward when the front cover member 4 is attached to the front side of the display device 2, and the protruded part 6 is visible from outside.

In addition, as shown in FIG. 12, when a reinforcing rib 7 is provided to at least a part of the front cover member 4 in order to lighten the front cover member 4 and made to hold the elastic member 5, there is a problem in that the elastic member 5 is linearly-squeezed only at a part 8 pressed by the reinforcing rib 7 and its surrounding part is raised. Accordingly, a holding effect by an equable pressure cannot be obtained.

SUMMARY OF THE INVENTION

In order to solve the above problems, a holding mechanism for a display device according to the present invention includes a front cover member which is attached to a surface of a housing containing a display device so as to cover the display device, and a thin plate-like member having shape retention which is attached to an elastic member on a side facing the front cover member in a holding mechanism for the display device. The elastic member is interposed between a rim of the display device and the front cover member, and the elastic member on which the thin plate-like member is adhered is attached to a reverse side of the front cover member.

According to the foregoing configuration, the following advantageous effects can be obtained. That is to say, since the thin plate-like member having shape retention is attached to the elastic member on the side facing the front cover member, the elastic member becomes difficult to deform and easy to handle to adhere on the reverse side of the front cover member. Therefore, the incidence of a position gap is decreased when adhering the elastic member to the reverse side of the front cover member, and the need for re-adhering can be reduced. As a result, unsightly appearance by damage of the elastic member due to the re-adhering and an exposure of the glue side for adhering the elastic member can be prevented.

Further, the elastic member is homogeneously-squeezed over a wide range pressed through the thin plate-like member since it is pressed via the thin plate-like member when the front cover member is attached to a front side of the display device. As a result, protruding of the elastic member can be reduced. Thus, unsightly appearance due to the protruding part being visible externally can be prevented.

In addition, the elastic member is homogeneously-squeezed via the thin plate-like member over a wide range, when the elastic member is held by a reinforcing rib provided to at least a part of the front cover member in order to make lighter the front cover member. As a result, the elastic member is prevented from being linearly-squeezed only at the part pressed by the reinforcing rib and its surrounding part is raised. Moreover, the holding effect by an equable pressure can be obtained.

According to this invention described in another embodiment of the present invention, the following functional effects will be obtained. That is to say, since the surface of the thin plate-like member having shape retention is antireflection-finished, the presence of the thin plate-like member can be unobtrusive externally. Further, it can be prevented that the reflected light from the thin plate-like member makes the display difficult to see and stands out in comparison with the display of the display device by the antireflection-finishing of the surface of the thin plate-like member.

According to this invention described in still another embodiment of the present invention, the following functional effects will be obtained. That is to say, the thin plate-like member becomes easier to handle and its workability can be improved by making the thin plate-like member at least partly larger than the elastic member in shape. Further, the elastic member can be made less visible by the thin plate-like member.

DETAILED DESCRIPTION OF THE PREFERRED EMBODIMENTS

A vehicle such as an automobile has an instrument panel installed on an anterior part thereof. A controller of an air-conditioner is installed at the center in the width direction of the instrument panel. Some of these controllers of an air-conditioner have a display device.

An embodiment of the present invention will be described hereinafter with reference to the drawings.

FIGS. 1 to 7 illustrate the embodiment and variations thereof.

Configuration

Hereinafter, a configuration of the embodiment is described.

Figure 1:
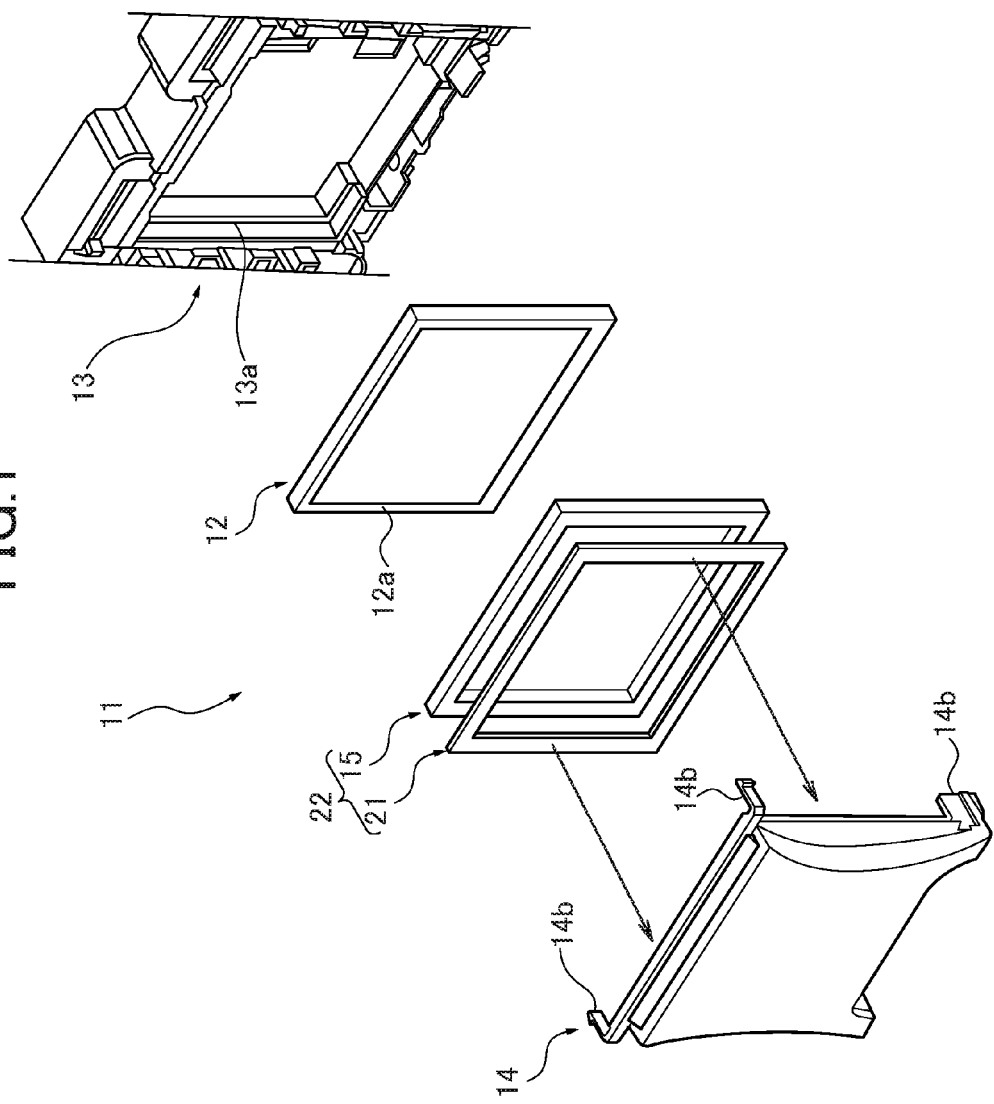
FIG. 1 is an exploded perspective view of a holding mechanism for a display device according to an embodiment of the present invention.
Figure 2:
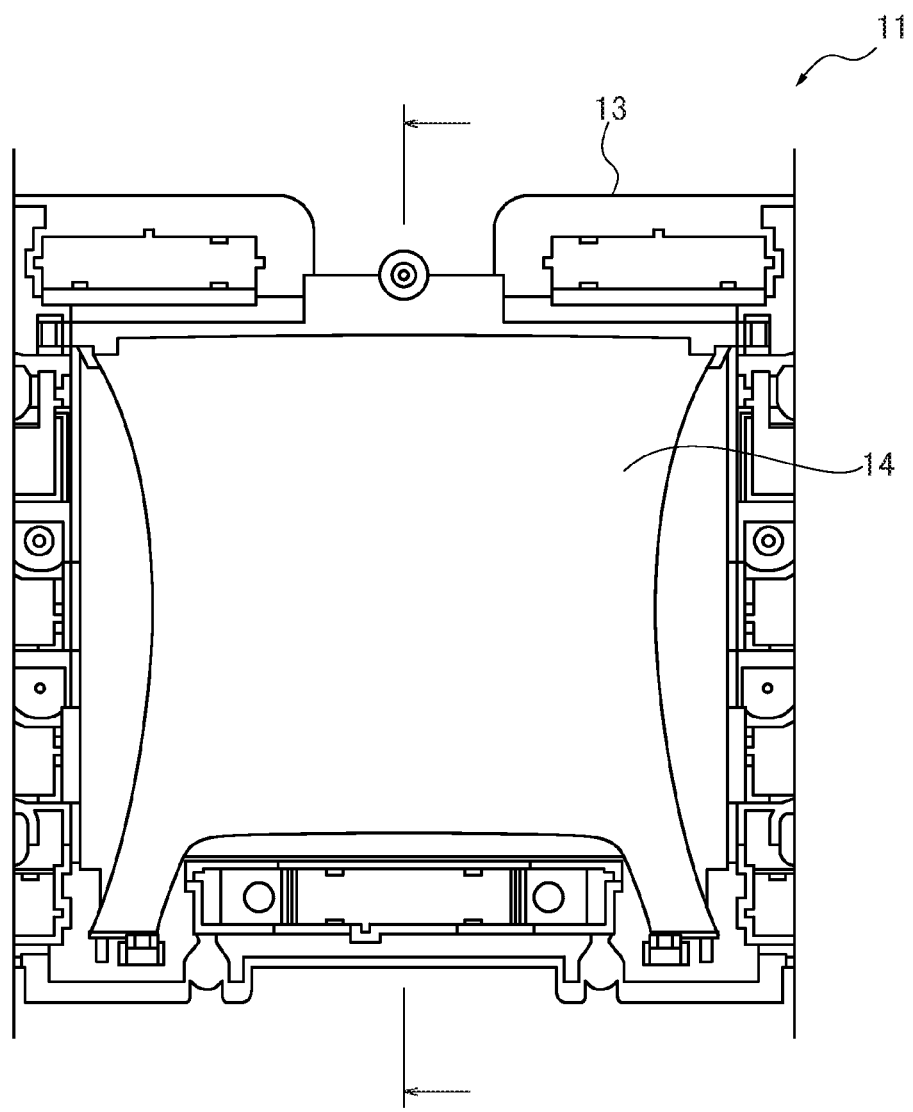
FIG. 2 is a front view of FIG. 1 in an assembled state.
Figure 3:
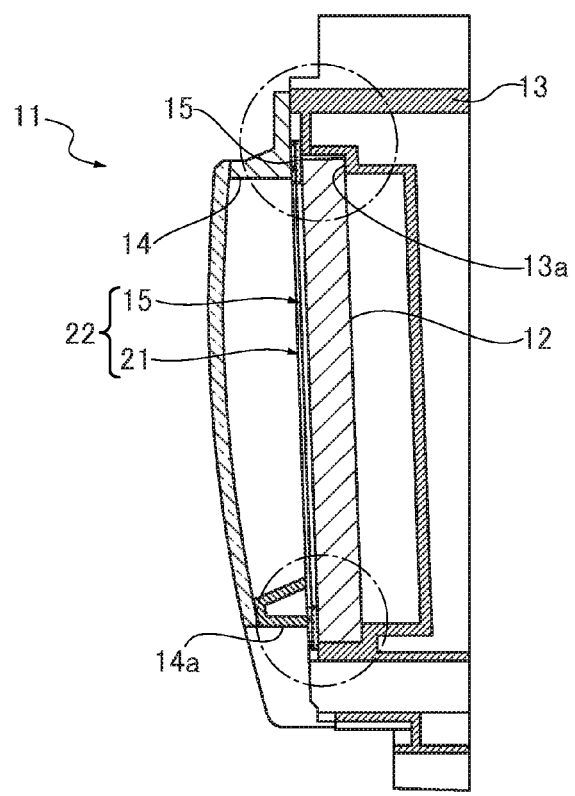
FIG. 3 is a longitudinal sectional view of FIG. 2 along the center line.

FIG. 1 illustrates a controller 11 of an air-conditioner having a display device.

As shown in FIG. 1 (see also FIGS. 2 to 5), it is assumed that the controller 11 includes a front cover member 14 attached to a surface of a housing 13 containing a display device 12 to cover the display device 12.

Then, an elastic member 15 is interposed between a rim of the display device 12 and the front cover member 14 as a basic configuration of a holding mechanism of the display device 12. A thin plate-like (plate-shaped) member 21 shown in FIG. 1 will be described further below.

Note that, the display device 12 is formed by, for example, a liquid crystal display, an organic electroluminescence display, and so on. The liquid crystal display includes a liquid crystal glass having a backlighting on its reverse side, and is covered entirely by a shielding member made of metal. The shielding member is attached to the rim of the surface of the display device 12 so as to form a frame-like part (frame-like member 12a).

The housing 13 is made of, for example, resin. In this case, the housing 13 is configured to be a casing of the controller 11 of an air-conditioning system. A storing recess 13a for containing the display device 12 and attaching portions (not shown) for attaching the front cover member 14 are formed in the housing 13.

The front cover member 14 is made of, for example, transparent resin. The front cover member 14 may be a lens formed by varying its thickness or by curving its surface. Moreover, the rim of the front cover member 14 can be painted a dark color with black paint or the like, or can be made of darkly-colored resin material. Further, attaching portions 14b for attaching the front cover member 14 to the housing 13 are formed, for instance, on the corners of the front cover member 14.

For the elastic member 15, a material of urethane, sponge, gum, and so on, may be used. The elastic member 15 is assumed to be a frame shape surrounding the rim of the surface of the display device 12 (For instance, the frame-like member 12a).

Relative to the basic configuration above, this embodiment has the further configurations described below.

Configuration 1

Figure 6:
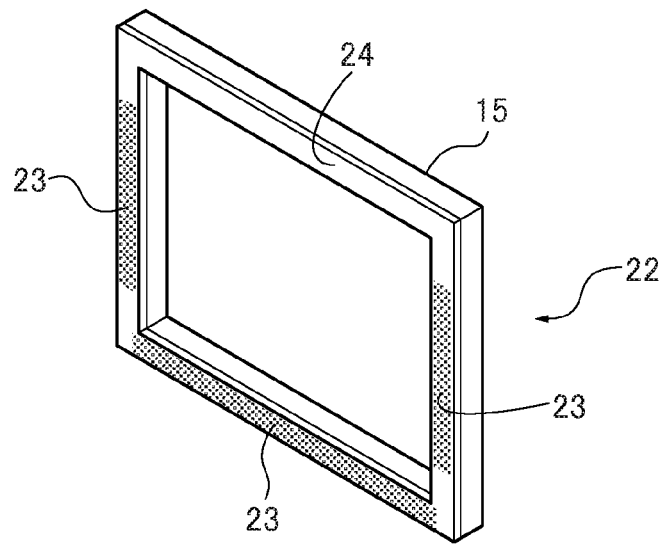
FIG. 6 is a perspective view of the compound packing shown in FIG. 1.
Figure 7:
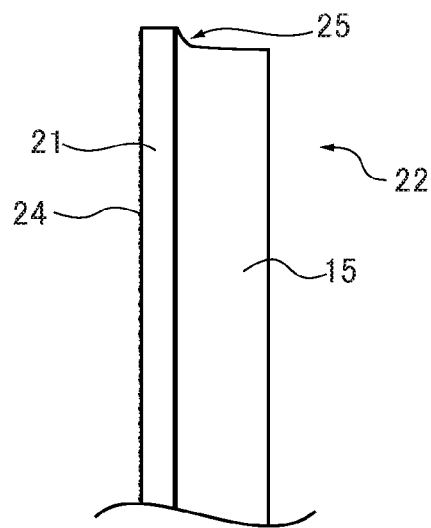
FIG. 7 is an enlarged side view of FIG. 6.
Figure 8:
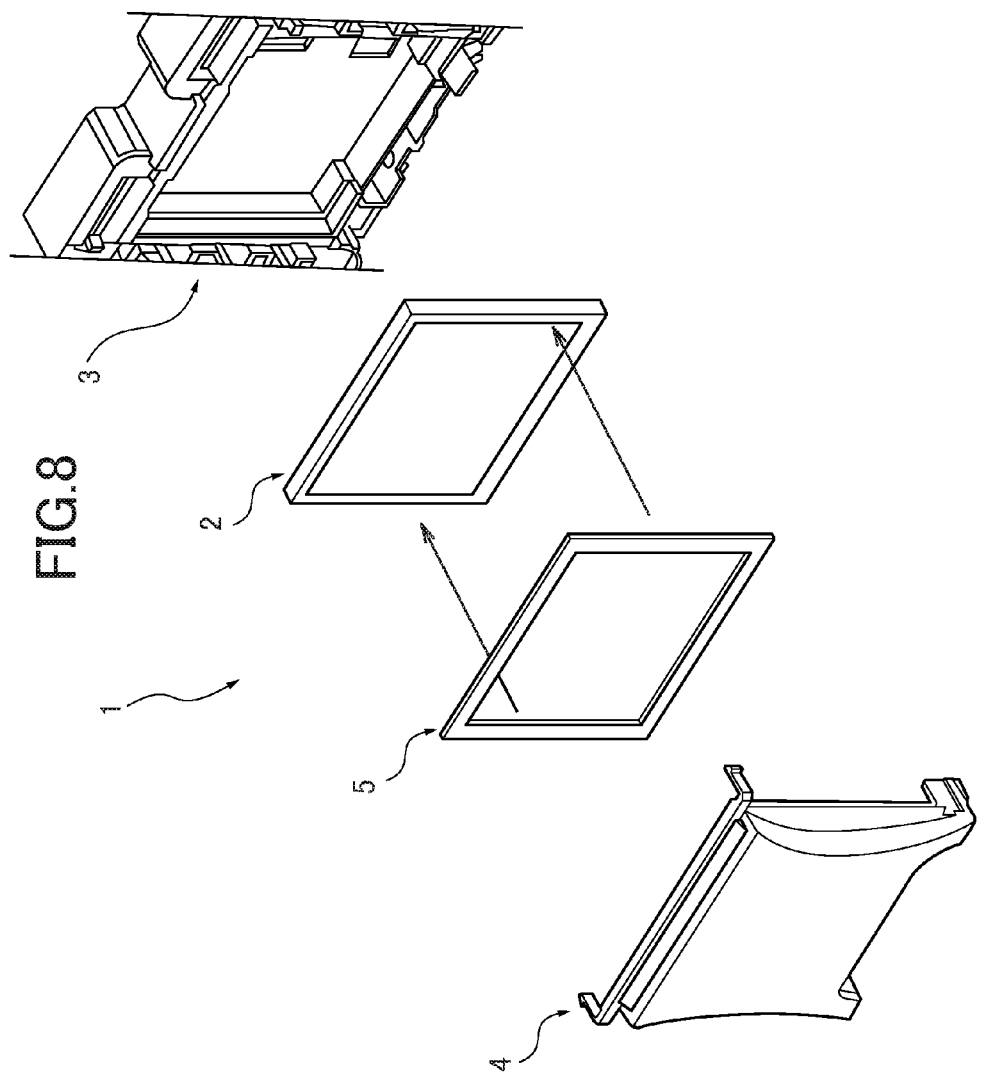
FIG. 8 is an exploded perspective view of a conventional holding mechanism for a display device.
Figure 9:
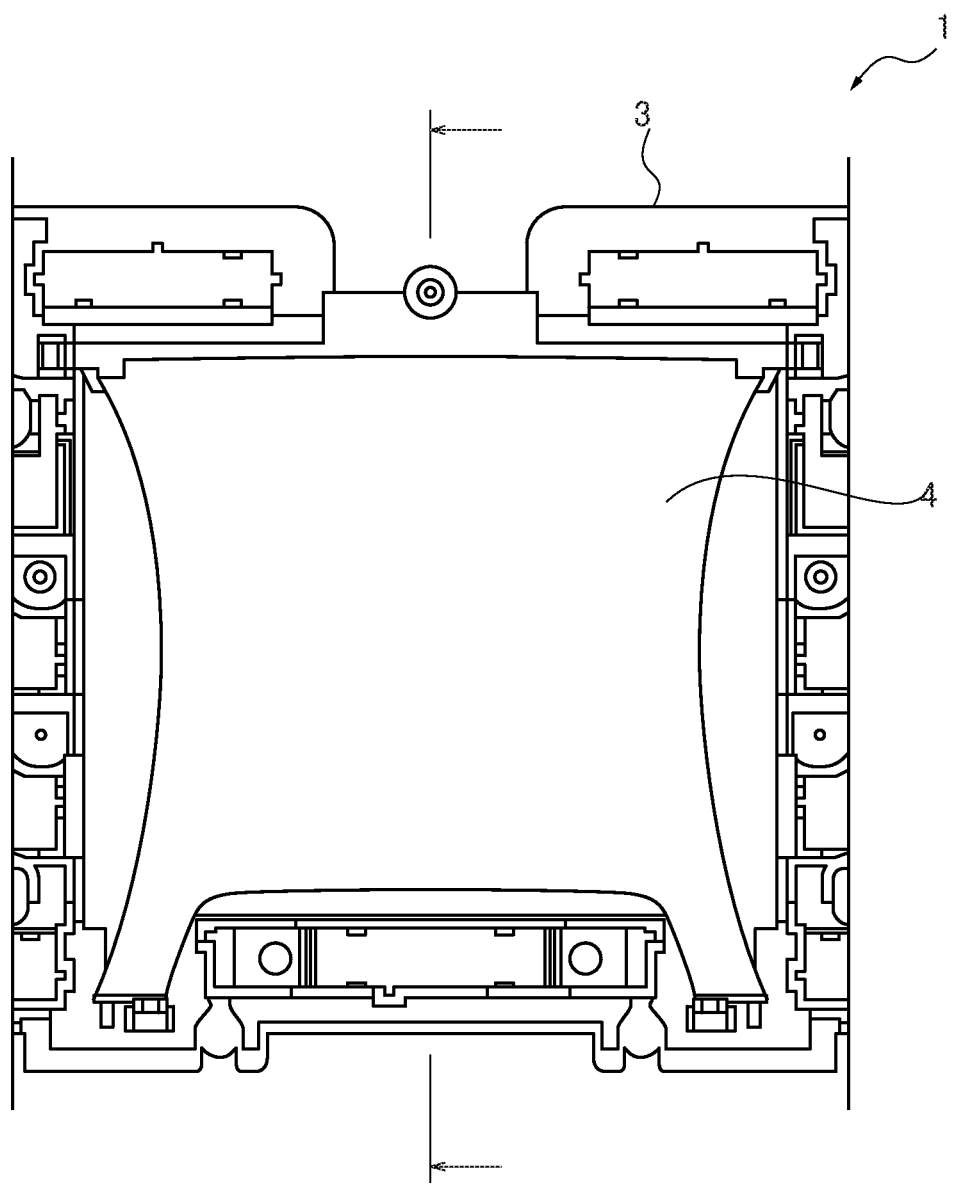
FIG. 9 is a front view of FIG. 8 in an assembled state.
Figure 10:
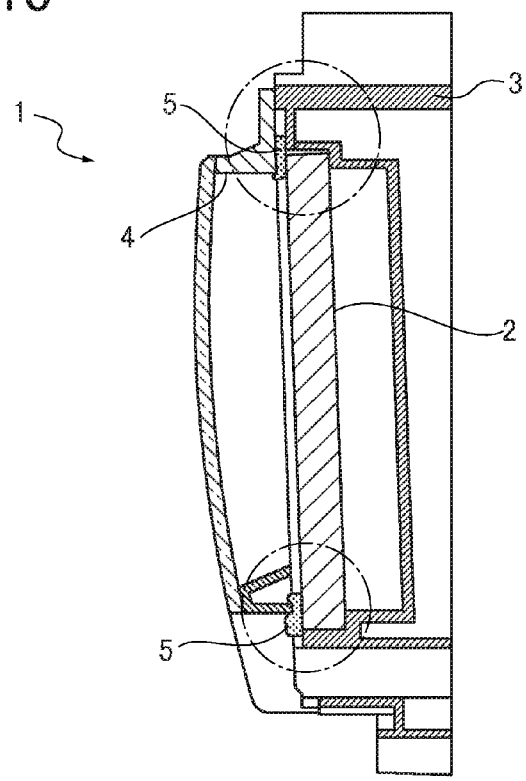
FIG. 10 is a longitudinal sectional view of FIG. 9 along a center line.
Figure 11:
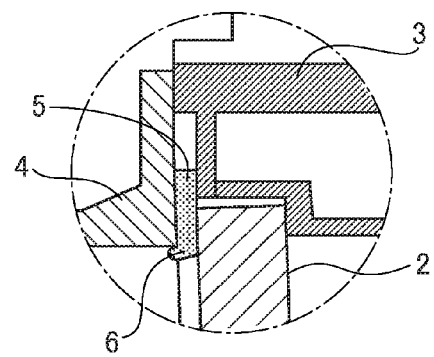
FIG. 11 is an enlarged sectional view of an upper part of FIG. 10.
Figure 12:
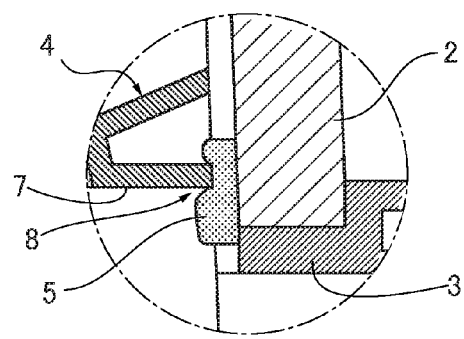
FIG. 12 is an enlarged sectional view of a lower part of FIG. 10.

As shown in FIG. 6 and FIG. 7, a thin plate-like (plate-shaped) member 21 having shape retention is attached to the elastic member 15 on a side facing the front cover member 14. The term "shape retention" means that a shape of the thin plate-like member 21 is not deformed even when the elastic member is compressed between the housing 13 and the front cover member 14.

Further, the elastic member 15 attached to the thin plate-like member 21 is attached to an internal surface (or reverse side) of the front cover member 14.

Supplement Example 1

Note that, for the thin plate-like member 21 described above, a resin plate, metal plate, and so on, may be used. In this case, the thin plate-like member 21 is assumed to be a resin plate. The thin plate-like member 21 is preferably a dark color such as black. When the thin plate-like member 21 is assumed to be a resin plate, it is preferable that the thin plate-like member 21 have a thickness of approximately 0.3 mm to 1 mm in order to have shape retention. If the thin plate-like member 21 is thinner than 0.3 mm, it cannot maintain the shape retention. And, if the thin plate-like member 21 is thicker than 1 mm, it cannot be attached since the thin plate-like member 21 becomes thicker than the gap between the display device 12 and the front cover member 14. The thin plate-like member 21 is assumed to be a frame shape surrounding the rim of the surface of the display device 12 (for instance, the frame-like member 12a).

Then, a compound packing (a frame-shaped packing) 22 is formed by the elastic member 15 attached to the thin plate-like member 21.

On the obverse side (side facing the front cover member 14) of the thin plate-like member 21, an adhesive material 23 for attaching to the internal surface of the front cover member 14 is applied in advance. The adhesive material 23 can be partly or wholly applied to the surface of the thin plate-like member 21. In this case, the adhesive material 23 is applied to a position that is not visible externally when the front cover member 14 is mounted.

Configuration 2

The surface of the thin plate-like member 21 having shape retention is antireflection-finished (antireflective-finished part 24 shown in FIG. 7).

Supplement Example 2

Here, for instance, the antireflective finishing (the antireflective-finished part 24) can be a surface texturing, matte finish (fine concavo-convex processing), and so on.

Configuration 3

The thin plate-like member 21 having shape retention is made at least partly larger than the elastic member 15 in shape (slightly uneven part 25).

Supplement Example 3

A part (compound packing 22) consisting of the elastic member 15 and the thin plate-like member 21 is preferably produced by punching into a frame shape a compound sheet which is made of the elastic member 15 and the thin plate-like member 21 adhered together and integrated in advance.

Then, while the elastic member 15 is kept inflated laterally by compressing the compound sheet with high pressure, the compound sheet is punched from the side of the thin plate-like member 21 and released from the pressure. Therefore, the compound packing 22 wherein the shape of the thin plate-like member 21 is slightly larger than the elastic member 15 can be obtained in a single process.

Note that, to obtain the compound packing 22 wherein the thin plate-like member 21 is entirely larger than the elastic member 15, the compound sheet shall be punched while compressing the whole part supposed to be the compound packing 22. On the other hand, to obtain the compound packing 22 wherein the thin plate-like member 21 is partly larger than the elastic member 15, the compound sheet shall be punched while compressing a part of the compound sheet.

Function

Hereinafter, a function of this embodiment will be described.

When assembling the controller 11, firstly, the display device 12 shall be stored in the housing 13 to be held.

On the other hand, the elastic member 15 integrated with the thin plate-like member 21 shall be attached to the reverse (internal) side of the front cover member 14.

Next, by attaching the front cover member 14 to the housing 13, the elastic member 15 shall be interposed between the rim of the display device 12 and the front cover member 14, and the display device 12 shall be held by a pressing force of the elastic member 15.

ADVANTAGEOUS EFFECT OF THE INVENTION

According to this embodiment, the following effect will be obtained.

Effect 1

The elastic member 15 becomes difficult to deform by attaching the thin plate-like member 21 having shape retention to the elastic member 15 on a side facing the front cover member 14 thereof. Therefore, the elastic member 15 becomes easy to handle, and adherence to the reverse (internal) side of the front cover member 14 is made easier. Moreover, the incidence of a position gap is decreased when adhering the elastic member 15 to the reverse side of the front cover member 14, and the need for re-adhering can be reduced. As a result, unsightly appearance by damage of the elastic member 15 due to the re-adhering and exposure of the glue side for adhering the elastic member 15 can be prevented.

Figure 4:
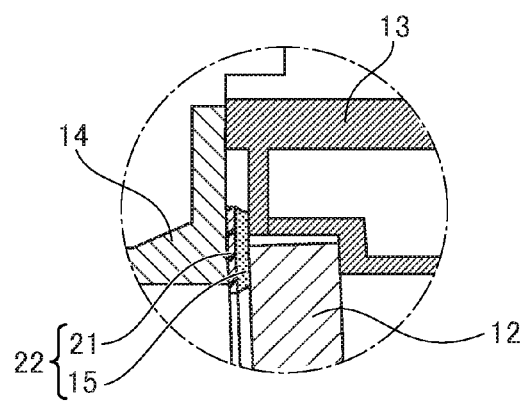
FIG. 4 is an enlarged sectional view of an upper part of FIG. 3.

Further, as shown in FIG. 4, protruding of the elastic member 15 can be reduced since the elastic member 15 is homogeneously-squeezed by the thin plate-like member 21 over a wide range. Thus, unsightly appearance can be prevented because a protruding part is not visible externally.

Figure 5:
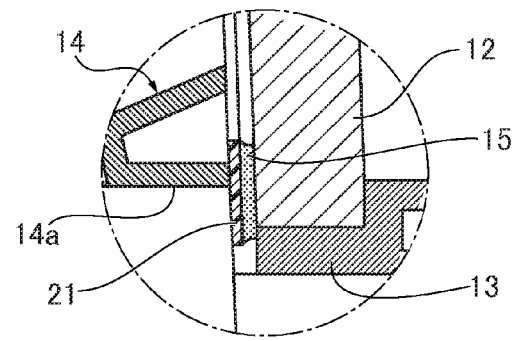
FIG. 5 is an enlarged sectional view of a lower part of FIG. 3.

In addition, as shown in FIG. 5, the elastic member 15 is homogeneously-squeezed via the thin plate-like member 21 over a wide range, when the elastic member 15 is held by a reinforcing rib 14a provided to at least a part of the front cover member 14 in order to make lighter the front cover member 14. As a result, the elastic member 15 is prevented from being linearly-squeezed at only the part pressed by the reinforcing rib 14a and its surrounding part is raised. Moreover, the holding effect by an equable pressure can be obtained.

Effect 2

The thin plate-like member 21 can be unobtrusive externally by processing the antireflection-finish on the surface of the thin plate-like member 21 having shape retention. Further, the reflected light from the thin plate-like member 21 can be prevented from making the display difficult to see and from standing out in comparison with the display of the display device 12 by the antireflection-finishing of the surface of the thin plate-like member 21.

Effect 3

The thin plate-like member 21 becomes easy to handle and its workability can be improved by making the thin plate-like member 21 at least partly larger than the elastic member 15 in shape. The elastic member 15 can be made less visible by the thin plate-like member 21.

Hereinabove, an embodiment of this invention has been described in detail with reference to drawings. However, the embodiment is merely an exemplary illustration of this invention. Thus, this invention is not limited solely to the configuration in the embodiment, and naturally includes design changes and the like without departing from the gist of this invention. Moreover, when an embodiment includes multiple configurations, for example, this invention naturally includes possible combinations of these configurations even without specific descriptions thereof. Further, when multiple embodiments and/or multiple modifications are given, this invention naturally includes possible combinations of configurations within these even without specific descriptions thereof. Also, this invention naturally includes the configurations depicted in the drawings even without specific descriptions thereof. Furthermore, the wording "and/or the like," is used to mean that an equivalent is included.

What is claimed is:

1. A holding mechanism for a display device comprising:
   a housing for containing the display device;
   a front cover member attached to a surface of the housing so as to cover the display device;
   an elastic member to be interposed between a rim of the display device and the front cover member; and
   a plate-like member having shape retention, the plate-like member being adhered to a surface of the elastic member facing the front cover member, the plate-like member having an antireflection finish,
   wherein the plate-like member is attached to an internal surface of the front cover member.

2. The holding mechanism for the display device according to claim 1, wherein the plate-like member is at least partly larger than the elastic member in shape.

3. An assembling method of a holding mechanism for a display device, said assembling method comprising:
   preparing a housing for containing a display device, a front cover member to be attached to a surface of the housing to cover the display device, an elastic member, and a plate-like member having shape retention;
   adhering the plate-like member to a surface of the elastic member facing the front cover member;
   making the elastic member and the plate-like member be adhered together into a frame shape;
   attaching the plate-like member to an internal surface of the front cover member; and
   performing an antireflection-finishing process to a surface of the plate-like member.

4. The assembling method of a holding mechanism for a display device according to claim 3, wherein the plate-like member is at least partly larger than the elastic member in shape.

5. An assembling method of a holding mechanism for a display device having a housing containing a display device, a front cover member to be attached to a surface of the housing to cover the display device, an elastic member, and a plate-like member having shape retention, said assembling method comprising:
   making the plate-like member at least partly larger than the elastic member in shape by:
      adhering together the elastic member and the plate-like member into an integrated compound sheet;
      compressing the compound sheet with high pressure to keep the elastic member inflated laterally;
      punching the compound sheet into a frame shape; and
      releasing the compound sheet from the pressure.

6. The assembling method of a holding mechanism for a display device according to claim 5, further comprising performing an antireflection-finishing process to a surface of the plate-like member.

* * * * *